United States Patent
Gallatin et al.

(10) Patent No.: US 7,366,342 B2
(45) Date of Patent: Apr. 29, 2008

(54) SIMULTANEOUS COMPUTATION OF MULTIPLE POINTS ON ONE OR MULTIPLE CUT LINES

(75) Inventors: Gregg M. Gallatin, Newtown, CT (US); Emanuel Gofman, Haifa (IL); Kafai Lai, Poughkeepsie, NY (US); Mark A. Lavin, Katonah, NY (US); Maharaj Mukherjee, Wappingers Falls, NY (US); Dov Ramm, Menashe (IL); Alan E. Rosenbluth, Yorktown Heights, NY (US); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 10/694,299

(22) Filed: Oct. 27, 2003

(65) Prior Publication Data

US 2005/0089211 A1 Apr. 28, 2005

(51) Int. Cl.
*G06K 9/00* (2006.01)
(52) U.S. Cl. .................. 382/144; 382/143; 382/145
(58) Field of Classification Search ............ 382/141, 382/143–151, 154; 345/419, 420; 348/86, 348/88, 125; 356/237.1, 237.4, 237.5
See application file for complete search history.

(56) References Cited

U.S. PATENT DOCUMENTS

| | | |
|---|---|---|
| 5,644,390 A | 7/1997 | Yasuzato |
| 5,647,027 A | 7/1997 | Burges et al. |
| 5,680,588 A | 10/1997 | Gortych et al. |
| 6,127,071 A | 10/2000 | Lu |
| 6,223,139 B1 * | 4/2001 | Wong et al. .................. 703/5 |
| 6,233,056 B1 | 5/2001 | Naulleau et al. |
| 6,263,299 B1 | 7/2001 | Aleshin et al. |
| 6,289,499 B1 | 9/2001 | Rieger et al. |
| 6,303,253 B1 | 10/2001 | Lu |
| 6,374,396 B1 * | 4/2002 | Baggenstoss et al. ......... 716/19 |
| 6,415,421 B2 | 7/2002 | Anderson et al. |
| 6,416,959 B1 * | 7/2002 | Giuliano et al. ............ 435/7.2 |
| 6,425,113 B1 | 7/2002 | Anderson et al. |
| 6,449,387 B1 | 9/2002 | Inui |
| 6,453,457 B1 | 9/2002 | Pierrat et al. |
| 6,460,997 B1 | 10/2002 | Frey et al. |
| 6,487,696 B1 | 11/2002 | Gudmundsson et al. |
| 7,031,529 B2 * | 4/2006 | Lee et al. .................. 382/226 |
| 2002/0062206 A1 | 5/2002 | Liebchen |
| 2002/0126267 A1 | 9/2002 | Smith |
| 2002/0159040 A1 | 10/2002 | Hamatani et al. |

* cited by examiner

*Primary Examiner*—Vikkram Bali
(74) *Attorney, Agent, or Firm*—DeLio & Peterson, LLC; Kelly M. Nowak; Steven Capella

(57) ABSTRACT

Methods, and program storage devices, for performing model-based optical proximity correction by providing a region of interest (ROI) having an interaction distance and locating at least one polygon within the ROI. A cut line of sample points representative of a set of vertices, or plurality of cut lines, are generated within the ROI across at least one lateral edge of the polygon(s). An angular position, and first and second portions of the cut line residing on opposing sides of an intersection between the cut line and the lateral edge of the polygon are determined, followed by generating a new ROI by extending the original ROI beyond its interaction distance based on such angular position, and first and second portions of the cut line. In this manner, a variety of new ROIs may be generated, in a variety of different directions, to ultimately correct for optical proximity.

30 Claims, 5 Drawing Sheets

SIMULTANEOUS COMPUTATION OF MULTIPLE POINTS ON ONE OR MULTIPLE CUT LINES

CROSS-REFERENCE TO RELATED APPLICATIONS

The present application is related to commonly assigned U.S. Pat. No. 7,010,776, titled "EXTENDING THE RANGE OF LITHOGRAPHIC SIMULATION INTEGRALS", U.S. patent application Ser. No. 10/694,465, titled "INCORPORATION OF A PHASE MAP INTO FAST MODEL-BASED OPTICAL PROXIMITY CORRECTION SIMULATION KERNELS TO ACCOUNT FOR NEAR AND MID-RANGE FLARE", U.S. patent application Ser. No. 10/694,473, titled "IMPROVEMENT OF PERFORMANCE IN MODEL-BASED OPC ENGINE UTILIZING EFFICIENT POLYGON PINNING METHOD", and U.S. Pat. No. 7,055,126, titled "RENESTING INTERACTION MAP INTO DESIGN FOR EFFICIENT LONGRANGE CALCULATIONS".

BACKGROUND OF THE INVENTION

1. Field of the Invention

This invention relates generally to the field of optical lithography, and in particular, to a method for model-based Optical Proximity Correction (OPC) that extends the Region of Interest (ROI) beyond its interaction distance (ID) to reduce the amount of time required to locate and summate convoluted vertices of a polygon within the ROI for the total convolution of such polygon.

2. Description of Related Art

In the fabrication of semiconductor devices, optical microlithography processing generally requires duplicating desired circuit patterns on a semiconductor wafer. These desired circuit patterns are represented as opaque and transparent regions on a template, referred to as a photomask, which are then projected onto photoresist-coated wafers by way of optical imaging through an exposure system.

A valuable tool for analyzing and correcting for optical lithography in semiconductor fabrication is an aerial image simulator. These aerial image simulators compute images generated by optical projection systems, such that, the modeling of aerial images is a crucial component in semiconductor manufacturing. However, since present lithographic tools employ partially coherent illumination, such modeling is computationally intensive for all but elementary patterns. The aerial image produced by the mask, i.e., the light intensity in an optical projection system's image plane, is a critically important quantity in microlithography for governing how well a developed photoresist structure replicates a desired mask design.

In OPC software, the image intensity is usually calculated by a bilinear transform having a specific kernel function that describes the physics of the process. This may be accomplished by way of an optical kernel corresponding to a Hopkin's integral or a composite kernel that includes resist effects. For example, for short range effects the bilinear transform can be optimally reduced to a sum of simple linear convolutions by the Sum of Coherent Sources (SOCS) method, whereas for intermediate range effects or other non-optical effects the bilinear transform may be reduced to a linear convolution between mask pattern and an intensity kernel.

For very long-range effects, the problem can be reduced still further to represent the mask by a coarse grid wherein each pixel is an average pattern density of features within that grid-square. The convolution between the coarse grid and the incoherent kernel can be done very rapidly, e.g. via Fast Fourier transform (FFT) to gain speed since an FFT can generate convolution for all pixels at the same time, or by newer more rapid methods that provide the same benefit.

However, the short and intermediate range is a critical part that can be time consuming due to the need to address individual polygons. Normal practice for calculating short and intermediate range effects typically includes spatially truncating the kernel by some practical assumption to provide a table lookup of the convolution of basic building block sectors which is stored within a table of finite and acceptable size.

The above prior art convolution techniques are commonly performed on polygon features using either sector-based algorithms or edge-based algorithms. These sector-based algorithms, which may be calculated using sectors at a variety of angles, allow for the convolution over a sector to be pre-calculated as base-images and stored in a table or matrix. For example, conventional practice for a sector based OPC engine may include decomposing a polygon into a collection of sectors of either 90-degree angles (as shown in FIG. 1) or 45-degree angles (as shown in FIGS. 2A-B).

For example, FIG. 1 depicts lookup table values for a variety of 90-degree sectors for various calculated points "X0" inside the square ROI 10. At any point "X0" inside the ROI, the table value is constant along any one of the straight contour lines 20. However, for any point "X0" 30 that resides outside ROI 10, the contour line 20 is extended outside the ROI, either horizontally or vertically, and the convolution value for such point "X0" 30 is taken at the boundary of the ROI along the same straight contour line at point "X0*" 30' as is shown.

Further with respect to FIG. 1, all convolution contributions of each point or vertex lying within the ROI are pre-calculated and stored in a matrix. That is, the table lookup comprises calculations for each and every point lying within the ROI. For all other points outside the ROI that are not contributing to the polygon, e.g., those points beyond the left and bottom boundaries of the ROI, the convolution values of such points are equal to zero. The convolution of the polygon, with the kernel, is then calculated by summing the contributions of each and every contributing pre-calculated, stored sector lying within the ROI. However, in so doing, it is required that each of these contributing pre-calculated, stored sectors be located within the ROI table lookup, and then its convolution contribution is retrieved for the summation of convolution of the polygon. This task is not only time consuming and tedious, but it also requires a sufficient amount of memory and storage capacity.

In another example of conventional sector based OPC calculations, FIGS. 2A and 2B illustrate lookup table values for 45-degree sectors that are skewed laterally, each having a 45-degree slope in the upper region and a constant value across the contour line. Accordingly, when point "X0" 30 lies above the ROI 10, the value will now be taken at point "X0*" 30' that lies on the boundary of ROI and along the same laterally skewed contour line. Similarly, at any point "X0" inside the ROI, the table value is constant along any one of the laterally skewed 45-degree sectors. Convolutions at each 45-degree sector vertex, i.e., point, are then calculated and stored in a matrix for the subsequent summation of convolution of the polygon. However, this approach is also time consuming and tedious as each pre-calculated, stored sector vertex of the polygon must be retrieved for the summation of convolution of all vertices of the polygon.

A further disadvantage of 45-degree sectors is that any points lying outside the radius relative to the vertex of the skewed ROI 10', as is depicted by the arrow in FIG. 2B, are outside of the pre-calculated matrix, and therefore, will not add any contribution to convolution of the polygon. As such, conventional practice is to extend the skewed ROI 10' by a distance of ((1-1/sqrt (2))×interaction distance (ID)) on all 4 sides of the table by this amount to provide a new ROI 15. Yet, in so doing, the table lookup must now be expanded to all 4 extended sides, such that the convolution contribution of each and every point or vertex residing within these extended 4 sides must now be calculated and stored within the table lookup. This adds to both time and memory requirements as these additional pre-calculated, stored vertices must now also be located for the total convolution summation of all vertices.

Other common techniques for convolving polygons for optical proximity correction include polygon pinning and polygon cropping procedures. Polygon cropping procedures generally involve generating multiple polygons representative of vertices of an original polygon(s), whereby these new vertices reside within or on the ROI boundary. A procedure referred to as the Intersection Method is such cropping technique. The Intersection Method generally involves generating multiple cropped polygons of an original polygon(s) using the algorithm C=A∪B, wherein shape A is a polygon, shape B is the ROI and intersections C are multiple new, smaller polygons. Once cropping is complete each vertex is then located and summated for the total convolution summation of the polygon. In so doing, this approach is also time consuming, tedious and requires a sufficient amount of memory as each vertex must be located, and then its convolution contribution retrieved for the summation of convolution of all vertices of the polygon. Polygon pinning procedures generally involve locating vertices residing outside the ROI and then pinning such vertices to the boundaries of or within the ROI. Pinning procedures are generally more efficient than cropping procedures in modeled based OPC, however, they still require a large amount of overhead if such procedure are repeated for the convolution calculation for all sample points in the ROI.

Consequently, a need exists in the art for providing improved fast, easy methods for summation of convolution contribution of vertices of a polygon for use in OPC engines.

Accordingly, the present invention overcomes the above problems and deficiencies in the prior art by providing improved methods for use in model-based optical proximity correction by defining a new ROI beyond its interaction distance ID to reduce the amount of time required to locate and summate convoluted vertices of a polygon within the ROI for the overall convolution summation of the polygon.

SUMMARY OF THE INVENTION

Bearing in mind the problems and deficiencies of the prior art, it is therefore an object of the present invention to provide improved methods, and a program storage device to perform such methods, for defining a new ROI beyond its interaction distance (ID) therein reducing the amount of time required to locate and summate convoluted vertices of a polygon within the ROI for the overall convolution summation of the polygon.

It is another object of the present invention to provide improved methods and program storage devices for defining a new ROI that easily and expeditiously summates the convolution of vertices of a polygon within a ROI.

Another object of the invention is to provide improved methods and program storage devices for making model-based optical proximity correction more efficient.

Yet another object of the invention is to provide improved methods and program storage devices for model-based OPC that avoids expansion of the lookup table for convolution contributions.

Still other objects and advantages of the invention will in part be obvious and will in part be apparent from the specification.

The above and other objects, which will be apparent to those skilled in art, are achieved in the present invention, which is directed to in a first aspect a method of performing model-based optical proximity correction by providing a ROI having an interaction distance and locating at least one finite geometrical shape within the ROI. At least one cut line is then generated across at least one lateral edge of such finite geometrical shape, and then the ROI is extended beyond its interaction distance based on a location of the at least one cut line across the lateral edge of the finite geometrical shape to correct for optical proximity.

Preferably, the finite geometrical shape is a polygon, such as, a regular, irregular, convex, concave, regular convex, regular concave, irregular convex or irregular concave polygon. The cut line preferably comprises a plurality of sample points representative of a set of vertices within the ROI, whereby the cut line comprises a first number of such sample points residing on a first side of an intersection between the cut line and the lateral edge and a second number of such sample points residing on a second side of the intersection. In this aspect of the invention, these first and second numbers of the plurality of sample points of the cut line may be either identical or different.

In this aspect of the invention, the extension of the ROI beyond its interaction distance is based on the location of the cut line, whether it is a horizontal cut line, a vertical cut line or a 45-degree cut line. Wherein the cut line is horizontal, the ROI is extended horizontally in a one-dimensional direction on opposing horizontal sides of the ROI. Wherein the cut line is vertical, the ROI is extended vertically in a one-dimensional direction on opposing vertical sides of the ROI. Further, wherein the cut line is a 45-degree cut line the ROI is extended two-dimensionally in both horizontal and vertical directions on all sides of the ROI.

Still further in this aspect, the above method steps may be repeated for a plurality of cut lines residing across the lateral edge of the finite geometrical shape, whereby the ROI is extended beyond its interaction distance based on a plurality of locations of the plurality of cut lines. Once the ROI is extended, i.e., a new ROI generated, the method further includes the step of simultaneously retrieving pre-calculated convolution contributions of multiple sample points across the at least one cut line in a single convolution contribution search step for summation of convolution within the ROI to correct for optical proximity.

In a second aspect, the invention is directed to a method of performing model-based optical proximity correction by providing a first ROI having an interaction distance and locating at least one polygon within the first ROI. At least one cut line is then located across at least one lateral edge of the polygon, whereby such cut line comprises a plurality of sample points representative of a set of vertices within the first ROI. An angular position of the cut line across the lateral edge of the polygon is determined, followed by determining first and second portions of the cut line residing on opposing sides of an intersection between the cut line and the lateral edge of the polygon. A second, new ROI is then provided by extending the first ROI beyond its interaction distance based on the angular position, and the first and second portions of the at least one cut line residing on the opposing sides of the intersection. This second ROI is ultimately for use in correcting for optical proximity. The method may further include locating within the first ROI a plurality of cut lines across the at least one lateral edge of the at least one polygon and providing the second ROI by extending the first ROI a plurality of times beyond its interaction distance based on the plurality of cut lines to generate a plurality of new regions of interest.

In this second aspect, the first and second portions of the cut line correspond respectively to first and second numbers of sample points from the plurality of sample points, wherein these first and second numbers may be identical to each other such that the first ROI is extended by equal portions on sides thereof, or the first and second numbers may be different from each other such that the first ROI is extended by unequal portions on sides thereof.

The cut line may be either a horizontal cut line or a vertical cut line, wherein the first ROI is extended respectively either horizontally in a one-dimensional direction, in an equal or unequal amount, or vertically in a one-dimensional direction, in an equal or unequal amount. Alternatively, the cut line may be a 45-degree cut line such that the first ROI is two-dimensionally extended on all sides thereof by a first function of $(d1)(\cos(\pi/4))$ on a first set of opposing edges of the first ROI and by a second function of $(d2)(\cos(\pi/4))$ on a second set of opposing edges of the first ROI.

Further in the second aspect, the step of extending the first ROI beyond its interaction distance also includes capturing additional polygons originally residing outside boundaries of the first ROI or additional portions of any polygons originally residing within or on the boundaries of the first ROI. The method may further include the step of simultaneously retrieving pre-calculated convolution contributions of multiple sample points across the at least one cut line in a single convolution contribution search step for summation of convolution of the set of vertices within the first ROI to correct for optical proximity.

In third and fourth aspects of the invention, the present invention is directed to program storage devices that are readable by a machine, which tangibly embody a program of instructions executable by the machine to perform the above method steps for performing model-based optical proximity corrections in relation to the first and second aspects of the invention, respectively.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(s)

Figure 1:
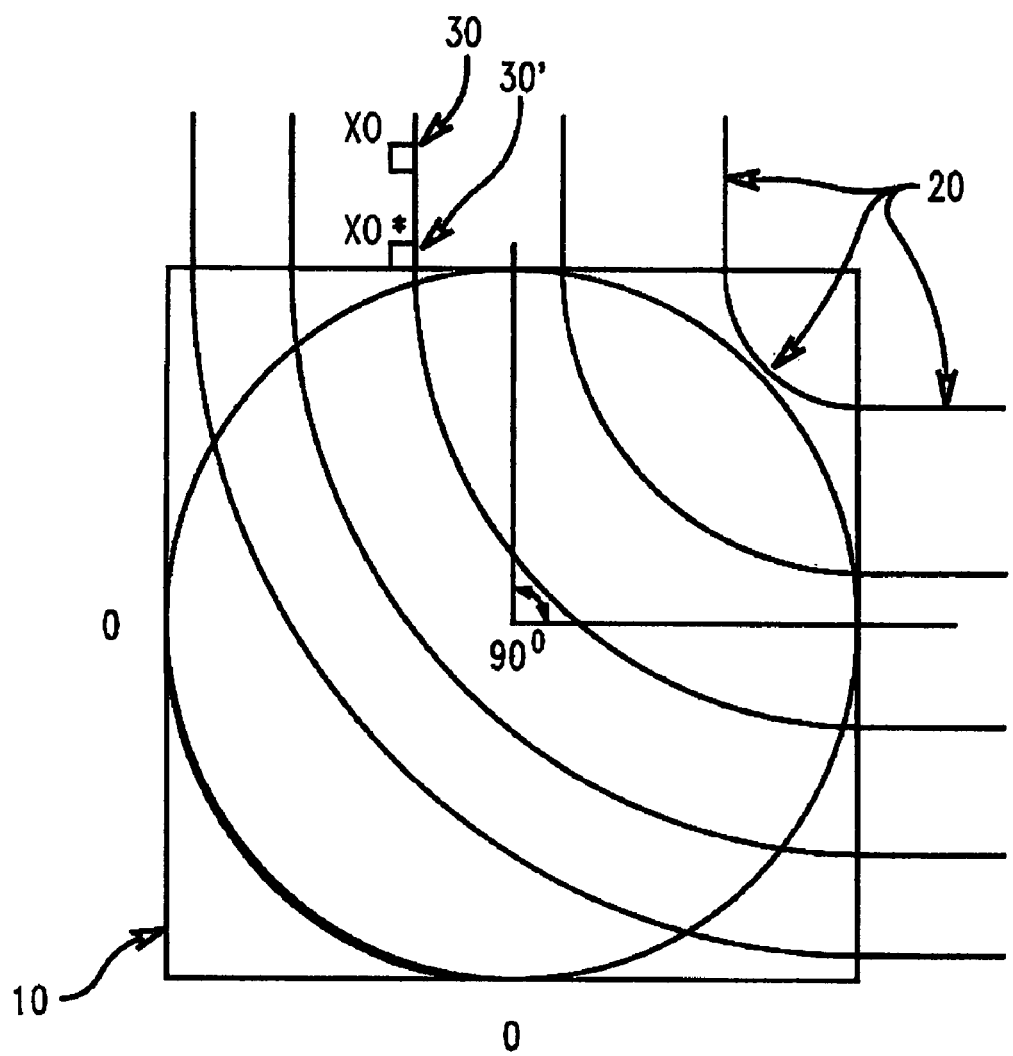
FIG. 1 is a prior art schematic illustration showing a sector based OPC engine decomposing a polygon into a collection of sectors of 90 degree angles for allowing the convolution over the sector to be pre-calculated as base-images stored in tables.
Figure 2A:
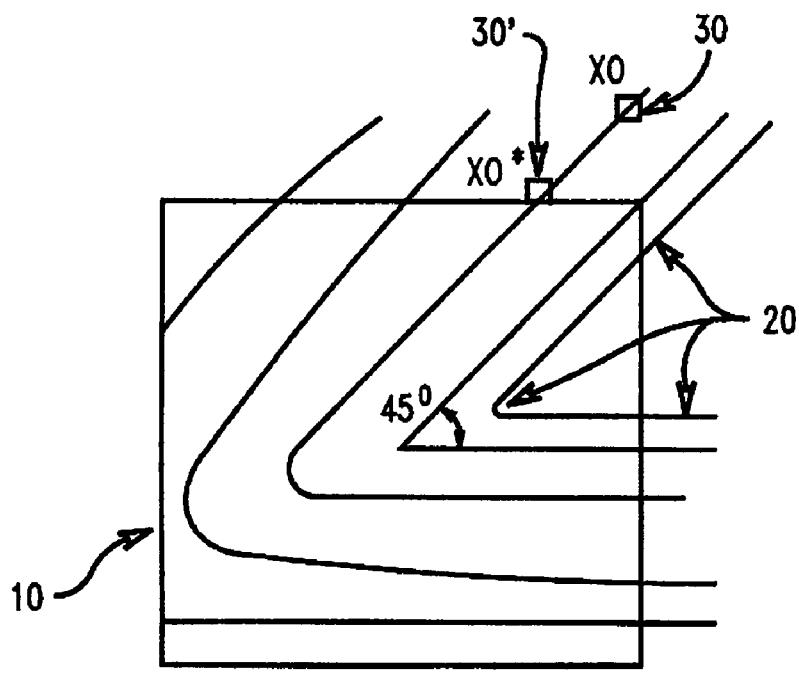
FIG. 2A is another prior art schematic illustration showing a sector based OPC engine decomposing a polygon into a collection of sectors of 45-degree angles for allowing the convolution over the sector to be pre-calculated as base-images which are stored in tables.
Figure 2B:
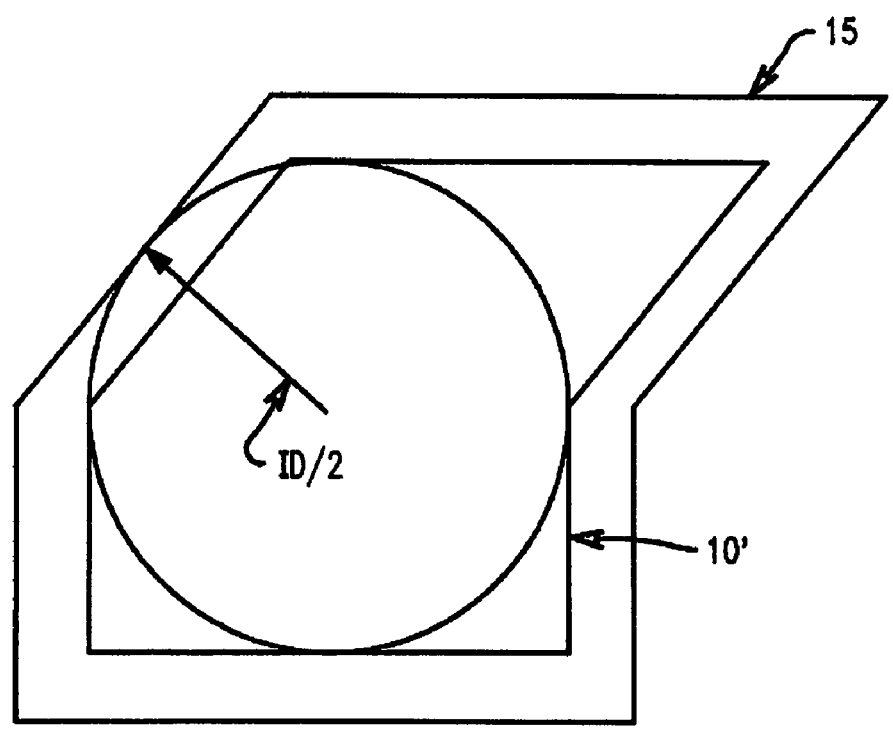
FIG. 2B is a prior art schematic illustration of FIG. 2A showing that the table look up area must be skewed in a similar manner as the region of interest to include certain x0 values.

In describing the preferred embodiment of the present invention, reference will be made herein to FIGS. 1-5 of the drawings in which like numerals refer to like features of the invention.

The present invention is directed to model-based optical proximity correction (OPC) for use in optical lithography that modifies the region of interest (ROI) to save both computation time and memory. The ROI is a convex area having a diameter across a line through its center point that is at least as large as the interaction distance (referred to as "ID" in the drawings), wherein the interaction distance is twice the distance beyond which any two points have negligible interaction with each other. Ultimately, the invention is used to correct for any distortions on a photomask having desired circuit patterns, for the accurate projection thereof onto photoresist-coated wafers.

It should be understood that the invention is suitable for use with any finite geometrical shape. In the preferred embodiment, the finite geometrical shape is a polygon. A polygon in a design is typically defined by a set of vertices, edges, straight lines, and the like, and the corresponding sequence, for example by convention the left hand side of the forward moving edge may always be inside the polygon. In accordance with the invention, the polygon may be regular or irregular, convex or concave, or any combination thereof. Further, the polygon may comprise any shape including, but not limited to, a triangle, quadrilateral (square, rectangle, parallelogram), pentagon, hexagon, heptagon, octagon, nonagon, decagon, and the like.

The present invention provides efficient methods for use in model-based optical proximity correction by defining a ROI beyond its interaction distance with the advantage of reducing the amount of time required to locate and summate convoluted vertices of a polygon within the ROI, for the total convolution summation of the polygon. The foregoing model-based simulation preferably occurs after the pre-calculation and storage of the convolution of all points, i.e., vertices or sectors of a finite geometrical shape (such as a polygon), within the original ROI.

Conventionally, in order to sum the convolution contribution of the polygon(s) within the ROI, each and every vertex of the polygon must first be located and then its pre-calculated convolution contribution retrieved from the storage component of the system. Once all of such vertices are located and the pre-calculated convolution contribution retrieved, those having contributing convolution are summated to attain the total convolution of the polygon. In so doing, this approach not only requires extensive calculations and memory capacity, it is also undesirably time consuming and tedious.

Advantageously, the foregoing invention provides for improved performance in model-based OPC engines by simultaneously computing multiple sample points for the summation of convolution of polygons within the ROI, in addition to simultaneously determining an amount to expand the ROI beyond its interaction distance. In accordance with the invention, the ROI may be expanded beyond its interaction distance at one, two, three or all four sides of the ROI.

In expanding the ROI, at least one polygon within the ROI is initially located, followed by locating at least one cut line across a lateral edge of the polygon. Alternatively, multiple cut lines may be located within the ROI. Each of these cut lines includes multiple sample points corresponding to a single set of vertices within the ROI. An essential feature of the invention is that as these multiple sample points across a single cut line correspond to a single set of vertices, the table lookup for these sample points is performed simultaneously, even though convolution contributions for these varying points may differ.

That is, the invention advantageously provides for extending the ROI based on a number of sample points representative of a single polygon within the ROI such that only a single convolution contribution search is required for retrieving the convolution contributions of such sample points for the summation of convolution of such single polygon within the ROI. The invention avoids the need to locate each individual sample point on a one-by-one basis and then perform the numerous convolution contribution searches for each of such located sample points, followed by performing numerous convolution summation algorithms for the individual sample points.

A benefit of the invention is that it avoids the need to repeatedly locate each and every vertex within the ROI, retrieve its respective convolution contribution for each vertex and then summate all of such contributions of the vertices for the total convolution of the polygon(s) within the ROI.

Figure 3:
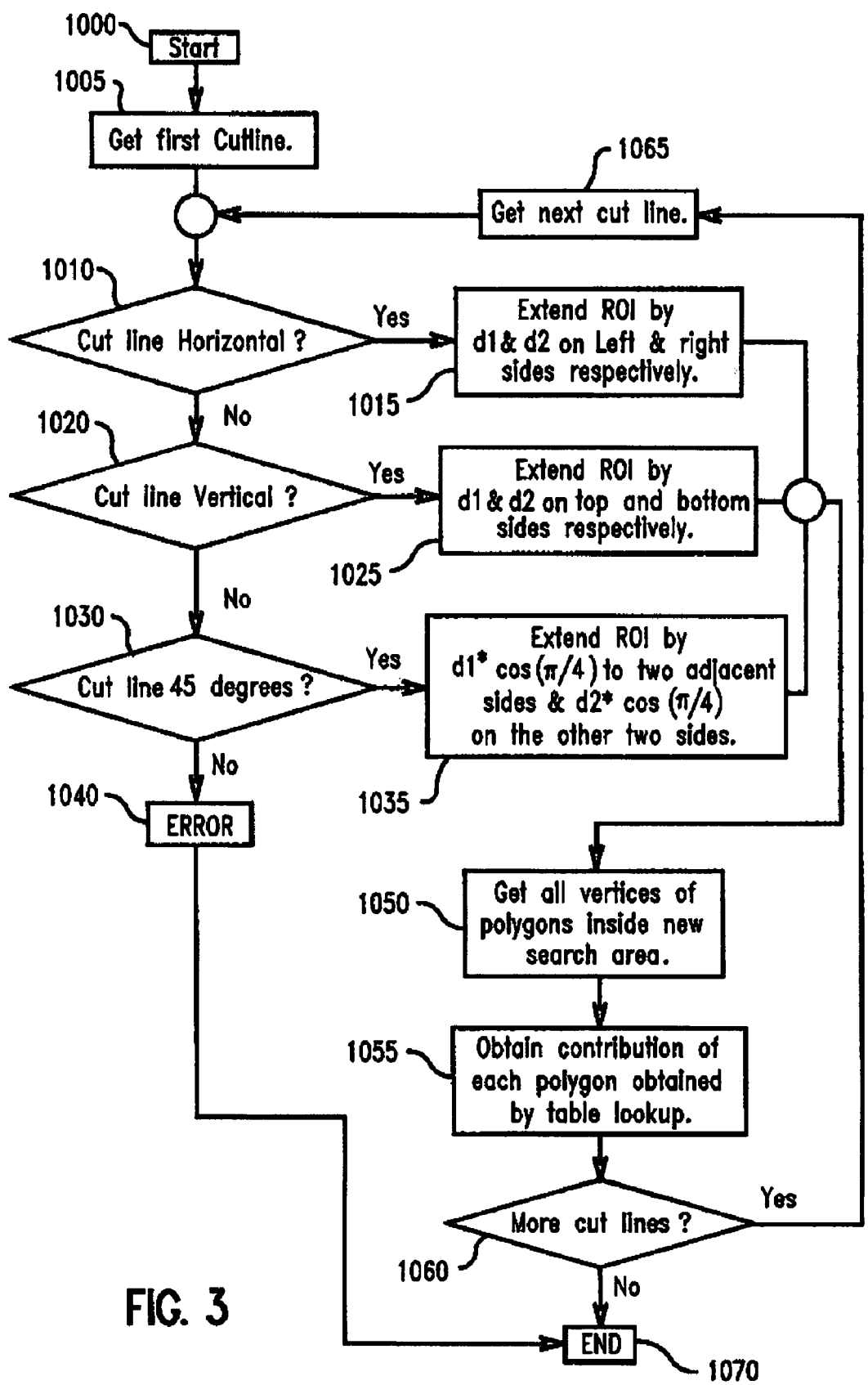
FIG. 3 is a block diagram flow chart of the preferred steps employed in practicing the present invention.

Referring to the drawings, the process flow of the invention will be better understood in accordance with the following description of the flow chart shown in FIG. 3.

Step 1000—Start. Start the process whereby the convolution contribution of all points of interest for all finite geometrical shape within the ROI are pre-calculated and stored in a storage component of the system, such as, in a table lookup.

Step 1005—Get first Cutline. Locate a polygon within the ROI and generate at least one cut line across at least one lateral edge of such polygon. The polygon may be composed of multiple segment lines that are defined by a set of user defined rules whereby at least one cut line is generated across at least one segment of the polygon. Alternatively, multiple cut lines are generated across a single segment or multiple segments of the polygon.

Step 1010—Cut line Horizontal? Determine whether the located cut line is horizontal with respect to a bottom lateral edge of the ROI. If the cut line is horizontal, then go to step 1015. If the cut line is not horizontal, then go to step 1020.

Step 1015—Extend the ROI by d1 on the left lateral edge and d2 on the right lateral edge of the ROI. The measures d1 and d2 may, or may not, be equal to each other. Continue to step 1050.

Step 1020—Cut line Vertical? If the cut line is not horizontal, then determine whether the located cut line is vertical with respect to the bottom lateral edge of the ROI. If the cut line is vertical, then go to step 1025. If the cut line is not vertical, then go to step Step 1025—Extend the ROI by d1 on the top lateral edge and d2 on the bottom lateral edge of the ROI. The measures d1 and d2 may, or may not, be equal to each other. Continue to step 1050.

Step 1030—Cut line 45-degrees? If the cut line is neither horizontal nor vertical, then determine whether the located cut line is a 45-degree sector, i.e., it forms a 45-degree angle. If the cut line is a 45-degree sector, then go to step 1035. If the cut line is not a 45-degree sector, then go to step 1040.

Step 1035—Extend the ROI by $(d1)((\cos)(\pi/4))$ to two adjacent lateral edges of the ROI and $(d2)((\cos)((\pi/4))$ on the remaining two adjacent lateral edges of the ROI. Continue to step 1050.

Step 1040—ERROR. There is an error in the process. Go to step 1070 and end the process.

Step 1050—Get all vertices of polygons inside new ROI. The ROI has now been expanded such that new polygons (polygons not within the original ROI) are now included in this new expanded ROI. These new polygons have additional vertices whereby the convolution contribution of each of these new vertices has been pre-calculated and stored for later use. All of such new vertices are now located within the new expanded ROI. Continue to step 1055.

Step 1055—Obtain contribution of each polygon obtained by table lookup. Once all new vertices within this new expanded ROI are located, the pre-calculated, stored convolution contribution of each of the new vertices are retrieved from the revised table lookup, for the ultimate summation of convolution of the polygon, and the process continues to step 1060.

Step 1060—More cut lines? Determine whether any more cut lines reside within the new expanded ROI (which includes the original ROI). If yes, go to step 1065. If no, go to step 1070 and end the process.

Step 1065—Get next cut lines. If there are more cut lines within the new expanded ROI, then continue to step 1010.

Step 1070—END. End the process.

Figure 4A:
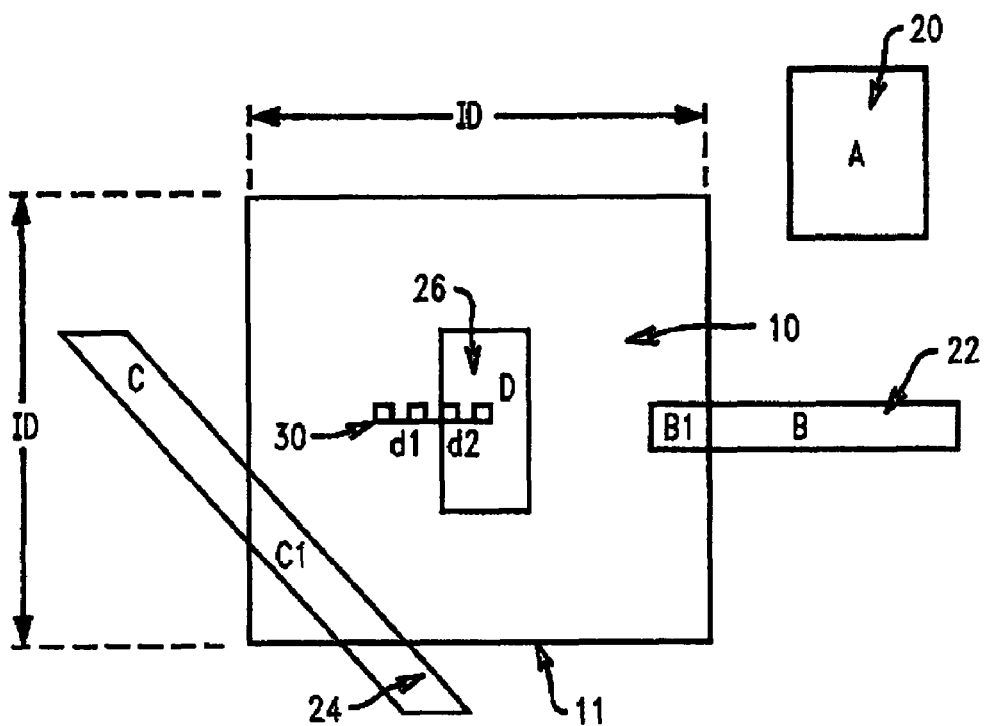
FIG. 4A is a schematic of the present invention showing a group of polygons within and outside a region of interest, for use with the process flow of FIG. 3, whereby the region of interest has a number of points along a cut line across a lateral edge of one of the polygons within the ROI for 90-degree sectors.
Figure 4B:
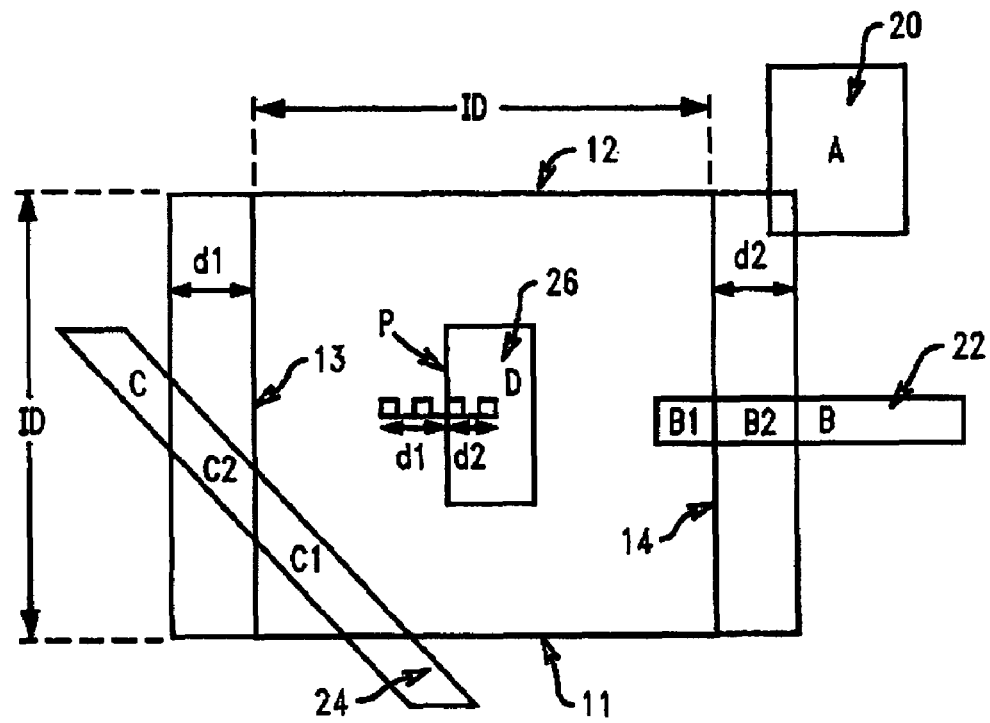
FIG. 4B is a schematic of the present invention showing the expansion of the region of interest of FIG. 4A for 90-degree sectors by a portion of the cut line size in one direction and the remaining portion of the cut line size in the opposite direction in accordance with the process flow of FIG. 3.

Referring now to FIGS. 4A-B the present process flow and method of simultaneous computation of multiple points on one or multiple cut lines are illustrated for 90-degree sectors for various points or vertices within a ROI 10. As shown in FIG. 4A, a plurality of finite geometrical shapes 20, 22, 24, 26, i.e., polygons A, B, and D, may reside within and outside of the ROI 10. In calculating the convolution for any point "X0" within the optical viewing window of the ROI 10, i.e., ID×ID in FIGS. 4A-B, all polygons having at least one vertex residing within the ROI are initially located. In so doing, polygons B, C and D of FIG. 4A would be located. Only those polygons having vertices within the ROI will add convolution contribution to the value at the sample point "X0".

In accordance with the invention, the foregoing process is preferably initiated after all sectors are located inside and outside the ROI and the convolution contribution of each vertex of such sectors are pre-calculated and stored in a table lookup. Any cropping and pinning procedure may be applied to the polygons during the present invention.

Once all convolution contribution of sectors inside and outside the ROI are pre-calculated and stored, the foregoing system and process are initiated by locating at least one polygon within the ROI followed by locating at least one cut line across a lateral edge of the located polygon. As shown in FIGS. 4A-B, polygon D 26 is located within the ROI 10. This polygon D may be at any location within the ROI and may consist of a plurality of segments across the lateral edges thereof.

Subsequently, at least one cut line 30 is generated in a predetermined location across at least one lateral edge of polygon D 26. The cut line may be generated by known techniques. Alternatively, a plurality of cut lines 30 may sequentially or simultaneously be generated across the same or differing lateral edges, or the same or differing segments, of the polygon D 26, or even across lateral edges and/or segments of lateral edges of a variety of differing polygons residing within the ROI 10. In accordance with the invention, the cut line 30 comprises a predetermined number of sample points that are selected based on a set of user-defined rules.

Once a first cut line is obtained, the process continues by determining whether the cut line is either horizontal or vertical, or alternatively a 45-degree sector. If it is determined that the cut line 30 is horizontal, with respect to a bottom lateral edge of the ROI, then the ROI will be extended horizontally at side edges of the ROI. Alternatively, if it is determined that the cut line 30 is vertical, with respect to such bottom lateral edge of the ROI, then the ROI will be extended vertically at top and bottom lateral edges of the ROI. The extensions of the ROI in the present invention are based on the location of the cut line 30 across the edge of the polygon. That is, the ROI will be extended on a first side thereof based on an amount of cut line residing on a first side of the cut line based on the intersection between the cut line and the edge of the polygon, and extended on the opposing side of the ROI based on a remaining amount of the cut line residing on the opposing side of such intersection.

For ease of understanding, as shown in FIG. 4A, cut line 30 is a horizontal cut line with respect to the bottom edge 11 of ROI 10 and resides across a horizontal lateral side edge of polygon P. As the cut line 30 is horizontal, the ROI is extended in accordance with the invention by a dimension "d1" on a first lateral side edge 13 of the ROI, and a dimension "d2" on the opposing, second lateral side edge 14 of the ROI. Alternatively, wherein the cut line 30 is a vertical cut line and resides across a top or bottom lateral edge of polygon P, the ROI would be extended by dimension "d1" on a top lateral edge 12 of the ROI and dimension "d2" on the bottom lateral edge 11.

The dimensions "d1" and "d2" are determined by evaluating the sample points across the cut line 30 in relation to the intersection of the cut line across the polygon edge using a set of user predefined rules. A critical aspect of the invention is that the cut line 30 comprises a plurality of sample points "X0", whereby these sample points "X0" along a single cut line 30 correspond to a single set of vertices within the ROI. Thus, the ROI 10 may be extended in one direction on one side of the ROI by a portion of such cut line 30, which is based on a first number of the sample points "X0", i.e., "d1" residing on a first side of the intersection between the cut line with the polygon edge, and extended in the opposite direction on the opposite side of the ROI by the remaining portion of cut line 30, which is based on the remaining number of the sample points "X0" within the cut line 30, i.e., "d2" residing on the second side of such intersection. The extension of the ROI 10 is a simultaneous extension as the ROI is extended in opposing directions simultaneously, either horizontally or vertically.

In accordance with the invention, these dimensions "d1" and "d2" may, or may not, be equal to each other. As a result, the ROI 10 may be extended either horizontally or vertically by equal or unequal portions at opposing lateral side edges 13, 14 or opposing lateral top and bottom edges 11, 12, respectively, to form an extended ROI 30, as shown in FIG. 4B. An essential feature of the invention is that as cut lines are typically either horizontal or vertical, the invention allows for a one-dimensional extension or expansion of the ROI, i.e., either in horizontal directions or vertical directions. When extending the original ROI 10 one-dimensionally, this new extended ROI 30 will now have a substantially rectangular shape. The expanded ROI 30 of the invention advantageously enables the capturing of additional polygons within the new extended ROI 30 for evaluation, as well as increased portions of polygons already residing within the original ROI 10.

For example, as shown in FIGS. 4A-B, only portions B1 and C1 of polygons B and C, respectively, reside within the original ROI 10. Polygon A resides outside of the original ROI 10, and as such, any convolution contribution therefrom would not be included in the original ROI 10 for point P alone. However, in the newly expanded ROI 30 of the invention, increased portions of both polygons B and C, namely portions B2 and C2, now reside within ROI 30, as well as portions of polygon A residing within the expanded ROI 30 as shown in FIG. 4B, and as such additional convolution contribution is provided from these additional polygons and increased portions of preexisting polygons.

Another essential feature of the invention is that multiple table lookups for convolution contributions of sample points can be performed simultaneously for all sample points along a single cut line, or even a plurality of different cut lines, as a result of these sample points along a single cut line corresponding to a single set of vertices within the ROI. The simultaneous table lookups for convolution contributions of all the sample points across the cut line(s) is achievable in accordance with the invention whether the sample points have the same convolution contributions or a variety of differing convolution contributions. Once the multiple table lookups convolution contributions are retrieved, the invention advantageously allows the simultaneous computation of all such retrieved convolutions for the multiple sample points across a single cut line, or across a plurality of cut lines.

In so doing, the present invention advantageously avoids the time consuming, tedious prior art approaches of searching for sample points or vertices within a ROI and performing the convolution contribution table lookup steps for each of such points one-by-one. A critical feature of the invention is that it significantly improves the ease and rate of model-based OPC calculations, even in the case where additional vertices are captured by the new expanding ROIs in accordance with the invention. That is, the present approach of simultaneous computation of convolution for sample points within one or even multiple cut lines significantly enhances computation speed.

With conventional calculation methods, the time needed to calculate such convolution contribution of all N number of sample points along the single cut line is proportional to (N)(ID²)(u+v), wherein "u" represents the time to calculate the convolution contribution from a single polygon and "v" the time to count the number of polygons that intersect a unit area, having assumed that the number of contributing polygons will be proportional to ID².

With the present invention, the time needed to calculate convolution contribution of the N number of sample points along the single cut line is proportional to (N)(u)(ID)(ID+d)+(v)(ID)(ID+d'), and as such, is significantly less than the time required for conventional methods, wherein d and d' can be d1, d2, or any user defined number. This is because expansions d1 and/or d2, alone and/or combined, are significantly less in dimension that a dimension of the original ROI 10, while still capturing several new sample points or vertices, e.g., N>=2. Further, as expansions d1 and/or d2 are preferably relatively small expansions of the ROI, but greater than zero, the savings of time for the convolution calculation of the invention is a function of $(v)(N-1)(ID^2)$. In accordance with the invention, the execution time of the invention will be more efficient as long as the condition $d/ID<(N-1)(v)/(N)(u+v)$ is satisfied, which generally is satisfied as a result of the table lookup time for determining "u" is fast.

Figure 5:
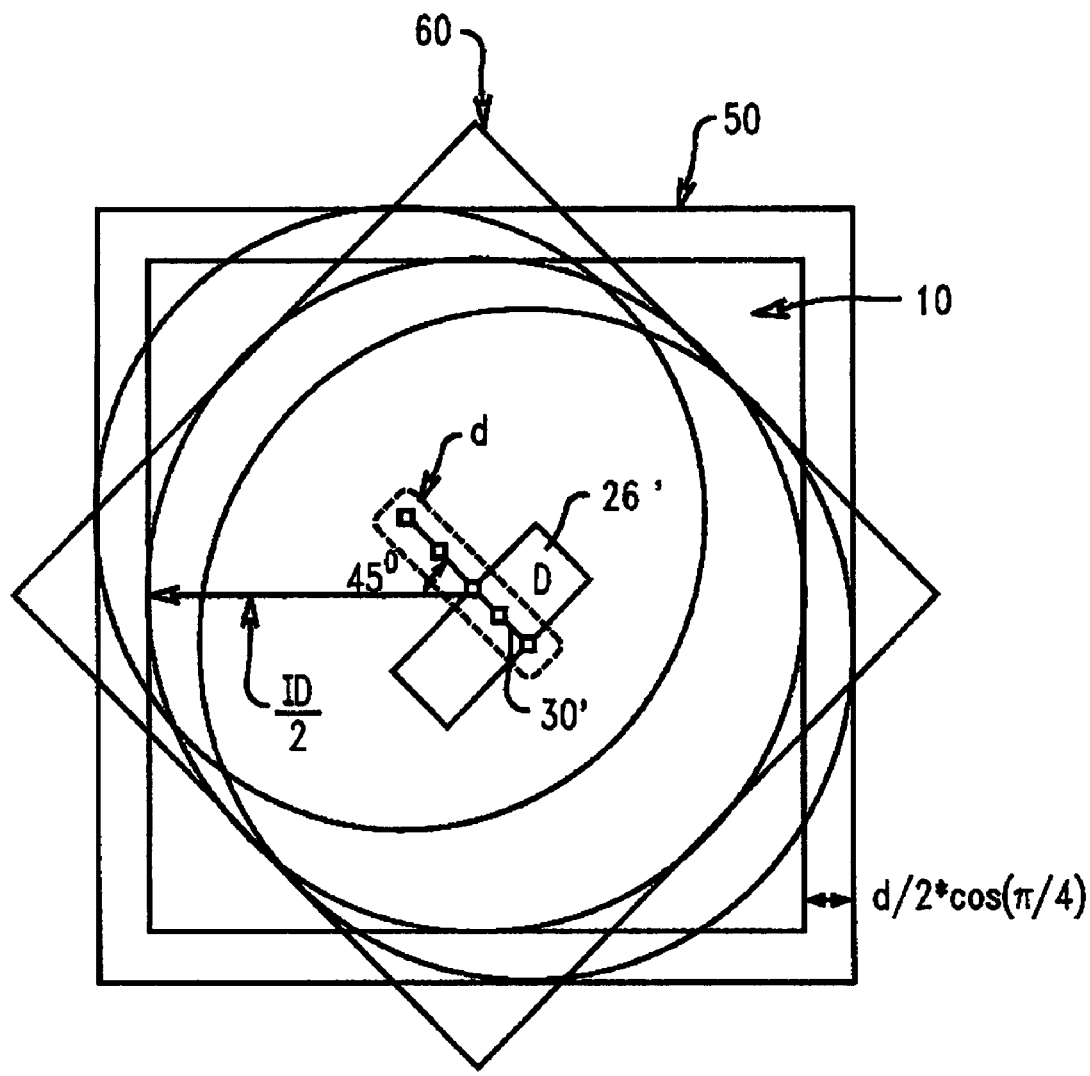
FIG. 5 is a schematic of the present invention showing the expansion of the region of interest for 45-degree sectors by portions of a cut line size on all four sides of the ROI in accordance with the process flow of FIG. 3.

As shown in FIG. 5, the present invention may also be used to expand the ROI when the cut line is a 45-degree cut line. In continuing the above process steps, wherein it is determined that the located cut line is neither a horizontal cut line nor a vertical cut line, it is next determined whether the cut line is a 45-degree cut line. If it is determined that the cut line is neither horizontal, vertical, nor 45-degrees, then an error has occurred in the method of the invention, and the process stopped.

However, wherein in-fact the cut line is actually a 45-degree cut line, the invention enables extending the original ROI 10 on all four sides, i.e., both lateral side edges and the top and bottom lateral edges, such that the ROI retains a substantially square shape. That is, in the case of 45-degree cut lines have a number N of sample points "X0" along the single 45-degree cut line 30' across a lateral edge of polygon D 26', the invention provides for a two-dimensional extension of the original ROI 10, as is further depicted by the rotational view 60 of ROI 10. This two-dimensional extension may even further increase the number of captured, additional polygons that originally resided outside the original ROI 10, as well as may capture even increased portions of those polygons originally residing within ROI 10, as compared to the one-dimensional expansion embodiment of the invention described above.

In accordance with the invention, in the case of a 45-degree cut line that includes a plurality of sample points across the single 45-degree cut line, ROI 10 is expanded on all four sides to form a new extended ROI 50. In forming the new extended ROI 50, the originally ROI 10 (and as shown in its rotational view 60) is two-dimensionally extended by a function represented as $(d/2)(cos(\pi/4))$ on each side of ROI 10, as shown in FIG. 5. As a result of the two-dimensional extension of ROI 10 being a function of $(cos(\pi/4))$ on all four sides of the ROI 10, the extension of ROI 10 on each side will be smaller than the one-dimensional extension of either the horizontal or vertical cut line for the 90 degree cut line embodiments of the invention. Alternatively, a further reduction may be made for the 45-degree cut line by truncating the upper right and lower left corners of the new extended ROI 50.

Wherein cut lines within the ROI are significantly close to each other, multiple convolutions may be performed on sample points that lie on multiple cut lines inside a rectangle of size D1×D2. In this manner, the ROI 10 will then be extended by the dimension D1 in horizontal directions and by D2 in vertical directions. This is particularly useful for those circuit designs having tight pitch patterns.

In any of the above embodiments of the invention, once the original ROI 10 is extended, on at least 2 sides or alternatively on all 4 sides, the present process flow continues by locating all additional captured polygons not originally residing within ROI 10, as well as any additional portions of original polygons residing in the ROI. The pre-calculated convolution contributions vertices representative of such polygons are then retrieved from the table lookup for the total convolution contribution of the sample points along the cut line. Thus, a critical feature of the invention is the extension of the original ROI and using this new extended ROI for further processing in accordance with the invention, as well as using this new extended ROI with conventional OPC processing steps and techniques.

The method of the invention continues for all cut lines within the ROI, and particularly those cut lines residing within the extended ROIs of the invention. Once it is determined that no more cut lines exist for use in the convolution summation of the present model-based OPC engine, the present process flow ends.

In view of the foregoing description, the present invention simultaneously extends the ROI on at least 2 sides, or optionally all 4 sides, based on multiple sample points across a cut line, prior to locating any polygons residing outside the original ROI, therein advantageously capturing such additional polygons, i.e., polygon A. In so doing, the invention provides a benefit by avoiding the cumbersome and time-consuming task of locating vertices within a ROI one-by-one and performing one-by-one their respective table lookup convolution contributions for each vertex. The invention also overcomes the problems associated with conventional approaches having to search for additional polygons residing outside the ROI, such as polygon A, followed by expanding the ROI on one side of the ROI in order to include such polygon within the ROI, and then locate all vertices of this polygon and retrieve their respective convolution contributions on a one-by-one basis. Further, the foregoing invention avoids the need to perform extensive book keeping steps to attain the convolution contribution for every polygon located on the ROI by simultaneously computing multiple sample points across a single cut line as discussed in detail above.

The method may be implemented through a computer program product stored on a program storage device that is readable by a machine and tangibly embodies a program of instructions executable by the machine to perform each of the method steps. The program storage devices of the present invention may be devised, made and used as a component of a machine utilizing optics, magnetic properties and/or electronics to perform the method steps of the present invention. Program storage devices include, but are not limited to, magnetic diskettes, magnetic tapes, optical disks, Read Only Memory (ROM), floppy disks, semiconductor chips and the like. A computer readable program code means in known source code may be employed to convert the methods described above for use on a computer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of performing model-based optical proximity correction to correct for distortions on a photomask comprising:
    providing a region of interest (ROI) having an interaction distance;
    locating at least one finite geometrical shape within said ROI;
    generating at least one cut line across at least one lateral edge of said at least one finite geometrical shape;
    extending said ROI beyond its interaction distance based on a location of said at least one cut line across said at least one lateral edge of said at least one finite geometrical shape to correct for optical proximity; and
    correcting for any distortions on a photomask using said corrected optical proximity.

2. The method of claim 1 wherein said finite geometrical shape comprises a polygon.

3. The method of claim 2 wherein said polygon is selected from the group consisting of regular, irregular, convex, concave, regular convex, regular concave, irregular convex and irregular concave.

4. The method of claim 1 wherein said at least one cut line comprises a plurality of sample points representative of a set of vertices within said ROI.

5. The method of claim 4 wherein said at least one cut line residing across said location of said lateral edge comprises a first number of said plurality of sample points residing on a first side of an intersection between said cut line and said lateral edge and a second number of said plurality of sample points residing on a second side of said intersection.

6. The method of claim 5 wherein said first and second numbers of said plurality of sample points of said cut line are identical.

7. The method of claim 5 wherein said first and second numbers of said plurality of sample points of said cut line differ.

8. The method of claim 1 wherein the step of extending said ROI beyond its interaction distance based on said location of said at least one cut line comprises determining whether said at least one cut line is selected from the group consisting of a horizontal cut line, a vertical cut line and a 45-degree cut line.

9. The method of claim 8 wherein said cut line comprises said horizontal cut line, the method including the step of extending said ROI horizontally in a one-dimensional direction on opposing horizontal sides of said ROI.

10. The method of claim 8 wherein said cut line comprises said vertical cut line, the method including the step of extending said ROI vertically in a one-dimensional direction on opposing vertical sides of said ROI.

11. The method of claim 8 wherein said cut line comprises said 45-degree cut line, the method including the step of extending said ROI in a two-dimensional direction on all horizontal and vertical sides of said ROI.

12. The method of claim 1 further including repeating said steps for a plurality of cut lines residing across said at least one lateral edge of said at least one finite geometrical shape, and extending said ROI beyond its interaction distance based on a plurality of locations of said plurality of cut lines.

13. The method of claim 1 further including the step of simultaneously retrieving pre-calculated convolution contributions of multiple sample points across said at least one cut line in a single convolution contribution search step for summation of convolution within said ROI to correct for optical proximity.

14. A method of performing model-based optical proximity correction to correct for distortions on a photomask comprising:
    providing a first region of interest (ROI) having an interaction distance;
    locating at least one polygon within said first ROI;
    locating at least one cut line across at least one lateral edge of said at least one polygon, said at least one cut line comprising a plurality of sample points representative of a set of vertices within said first ROI;
    determining an angular position of said at least one cut line across said at least one lateral edge of said at least one polygon;
    determining a first portion and a second portion of said at least one cut line residing on opposing sides of an intersection between said at least one cut line and said at least one lateral edge; and
    providing a second ROI by extending said first ROI beyond its interaction distance based on said angular position of said at least one cut line and said first and second portions of said at least one cut line residing on said opposing sides of said intersections;
    correcting for optical proximity using said second ROI; and
    correcting for any distortions on a photomask using said corrected optical proximity.

15. The method of claim 14 further including locating within said first ROI a plurality of cut lines across said at least one lateral edge of said at least one polygon and providing said second ROI by extending said first ROI a plurality of times beyond its interaction distance based on said plurality of cut lines to generate a plurality of new regions of interest.

16. The method of claim 14 wherein said first portion of said at least one cut line residing on said first side of said intersection corresponds to a first number of sample points from said plurality of sample points, while said second portion of said at least one cut line residing on said second side of said intersection corresponds to a second number of sample points from said plurality of sample points.

17. The method of claim 16 wherein said first and second numbers of said plurality of sample points of said cut line are identical, such that said second ROI is provided by extending said first ROI by an equal amount on at least two opposing sides of said first ROI.

18. The method of claim 16 wherein said first and second numbers of said plurality of sample points of said cut line differ, such that said second ROI is provided by extending said first ROI by an unequal amount on at least two opposing sides of said first ROI.

19. The method of claim 14 wherein said angular position of said at least one cut line across said at least one lateral edge of said at least one polygon is selected from the group consisting of a horizontal cut line, a vertical cut line and a 45-degree cut line.

20. The method of claim 19 wherein said cut line comprises said horizontal cut line, the method including the step of providing said second ROI by extending said first ROI horizontally in a one-dimensional direction on opposing horizontal sides of said first ROI.

21. The method of claim 20 wherein the first ROI is extended in an equal or unequal amount on said opposing horizontal sides of said first ROI.

22. The method of claim 19 wherein said cut line comprises said vertical cut line, the method including the step of providing said second ROI by extending said first ROI vertically in a one-dimensional direction on opposing vertical sides of said first ROI.

23. The method of claim 22 wherein the first ROI is extended in an equal or unequal amount on said opposing vertical sides of said first ROI.

24. The method of claim 19 wherein said cut line comprises said 45-degree cut line, the method including the step of providing said second ROI by extending said first ROI in a two-dimensional direction on all horizontal and vertical sides of said first ROI.

25. The method of claim 24 wherein said first ROI is extended by a first function of $(d1)(\cos(\pi/4))$ on a first set of opposing edges of said first ROI and by a second function of $(d2)(\cos(\pi/4))$ on a second set of opposing edges of said first ROI, such that said first ROI is extended on all sides of said first ROI.

26. The method of claim 25 wherein said first ROI is extended in an equal or unequal amount at said first set of opposing edges as compared to said second set of opposing edges.

27. The method of claim 14 wherein said step of extending said first ROI beyond its interaction distance further includes capturing additional polygons originally residing outside boundaries of said first ROI or additional portions of any polygons originally residing within or on said boundaries of said first ROI.

28. The method of claim 14 further including the step of simultaneously retrieving pre-calculated convolution contributions of multiple sample points across said at least one cut line in a single convolution contribution search step for summation of convolution of said set of vertices within said first ROI to correct for optical proximity.

29. A computer readable medium embedded with a computer program of instructions executable by the computer to perform method steps for performing model-based optical proximity correction to correct for distortions on a photomask, said method steps comprising:

provinding a region of interest (ROI) having an interaction distance;

locating at least one finite geometrical shape within said ROI;

generating at least one cut line across at least one lateral edge of said at least one finite geometrical shape;

extending said ROI beyond its interaction distance based on a location of said at least one cut line across said at least one lateral edge of said at least one finite geometrical shape to correct for optical proximity; and correcting for any distortion on a photomask using corrected optical proximity.

30. A computer readable medium embedded with a computer program of instructions executable by the computer to perform method steps for performing model-based optical proximity correction to correct for distortions on a photomask, said method steps comprising:

providing a first region of interest (ROI) having an interaction distance; locating at least one polygon within said first ROI;

locating at least one cut line across at least one lateral edge of said at least one polygon, said at least one cut line comprising a plurality of sample points representative of a set of vertices within said first ROI;

determining an angular position of said at least one cut line across said at least one lateral edge of said at least one polygon;

determining a first portion and a second portion of said at least one cut line residing on opposing sides of an intersection between said at least one cut line and said at least one lateral edge;

providing a second ROI by extending said first ROI beyond its interaction distance based on said angular position of said at least one cut line and said first and second portions of said at least one cut line residing on said opposing sides of said intersection;

correcting for optical proximity using said second ROI; and correcting for any distortions on a photomask using said corrected optical proximity.

* * * * *